United States Patent
Adusumilli et al.

(10) Patent No.: US 10,388,721 B2
(45) Date of Patent: Aug. 20, 2019

(54) CONFORMAL CAPACITOR STRUCTURE FORMED BY A SINGLE PROCESS

(71) Applicant: International Business Machines Corporation, Armonk, NY (US)

(72) Inventors: Praneet Adusumilli, Albany, NY (US); Alexander Reznicek, Troy, NY (US); Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/414,279

(22) Filed: Jan. 24, 2017

(65) Prior Publication Data
US 2018/0212019 A1    Jul. 26, 2018

(51) Int. Cl.
| | | |
|---|---|---|
| *H01L 21/8242* | (2006.01) | |
| *H01L 27/12* | (2006.01) | |
| *H01L 49/02* | (2006.01) | |
| *H01L 21/285* | (2006.01) | |
| *H01L 21/02* | (2006.01) | |

(52) U.S. Cl.
CPC .......... *H01L 28/91* (2013.01); *H01L 21/0228* (2013.01); *H01L 21/02175* (2013.01); *H01L 21/28556* (2013.01)

(58) Field of Classification Search
CPC ......... C23C 16/18; H01L 28/60; H01L 28/40; H01L 21/0228; H01L 27/10861; H01L 21/28556; H01L 27/1087; H01L 21/02183
See application file for complete search history.

(56) References Cited

U.S. PATENT DOCUMENTS

| | | |
|---|---|---|
| 5,770,510 A | 6/1998 | Lin et al. |
| 6,433,379 B1 | 8/2002 | Lopatin et al. |
| 6,905,925 B2 | 6/2005 | Mosley |
| 6,972,473 B2 | 12/2005 | Beroz |
| 7,037,801 B1 | 5/2006 | Hong et al. |
| 7,112,503 B1 | 9/2006 | Agarwal et al. |
| 7,413,948 B2 | 8/2008 | Sandhu |

(Continued)

FOREIGN PATENT DOCUMENTS

| | | |
|---|---|---|
| JP | 200981429 A | 4/2009 |
| KR | 100417893 B1 | 2/2004 |

(Continued)

*Primary Examiner* — Bradley Smith
*Assistant Examiner* — David J Goodwin
(74) *Attorney, Agent, or Firm* — Scully, Scott, Murphy & Presser, P.C.; Daniel P. Morris, Esq.

(57) ABSTRACT

A capacitor structure is provided that includes conformal layers of a lower electrode, a high-k metal oxide dielectric, and an upper electrode. The capacitor structure is formed by a single process which enables the in-situ conformal deposition of the electrode and dielectric layers of the capacitor structure. The single process includes atomic layer deposition in which a metal-containing precursor is selected to provide each of the layers of the capacitor structure. The lower electrode layer is formed by utilizing the metal-containing precursor and a first reactive gas, the high-k metal oxide dielectric layer is provided by switching the first reactive gas to a second reactive gas, and the upper electrode layer is provided by switching the second reactive gas back to the first reactive gas.

13 Claims, 4 Drawing Sheets

(56) References Cited

U.S. PATENT DOCUMENTS

| | | |
|---|---|---|
| 8,432,020 B2 | 4/2013 | Park et al. |
| 8,441,097 B2 | 5/2013 | Steigerwald et al. |
| 8,564,094 B2 | 10/2013 | Hu |
| 8,815,678 B2 | 8/2014 | Iizuka et al. |
| 2003/0100185 A1 | 5/2003 | Naito et al. |
| 2004/0087081 A1 | 5/2004 | Aitchison et al. |
| 2005/0277063 A1* | 12/2005 | Wang ............... G02B 5/1857 430/311 |
| 2008/0081113 A1* | 4/2008 | Clark ................ C23C 16/308 427/255.394 |
| 2009/0002917 A1 | 1/2009 | Kil et al. |
| 2009/0081885 A1 | 3/2009 | Levy et al. |
| 2011/0095397 A1* | 4/2011 | Chung ............ H01L 21/02175 257/532 |
| 2011/0216585 A1* | 9/2011 | Goswami .............. C01B 21/06 365/185.01 |
| 2011/0279900 A1* | 11/2011 | Wang .................... B82Y 20/00 359/576 |
| 2013/0062677 A1* | 3/2013 | Li ........................ H01L 21/84 257/301 |
| 2016/0180982 A1* | 6/2016 | Engel-Herbert ......... H01B 1/08 428/220 |
| 2016/0307904 A1* | 10/2016 | Lansalot-Matras ........................ H01L 27/1085 |

FOREIGN PATENT DOCUMENTS

| | | |
|---|---|---|
| KR | 100844956 B1 | 7/2008 |
| KR | 1020090045678 A | 5/2009 |

* cited by examiner

CONFORMAL CAPACITOR STRUCTURE FORMED BY A SINGLE PROCESS

BACKGROUND

The present application relates to a semiconductor structure and a method of forming the same. More particularly, the present application relates to a semiconductor structure including a conformal metal-insulator-metal capacitor that is formed utilizing a single process which enables the in-situ conformal deposition of electrode (i.e., metal or metal nitride) and dielectric layers of the capacitor structure.

As semiconductor device dimensions continue to shrink, there is increasing difficulty in creating capacitor structures which can meet desired performance metrics. Dielectric materials having a dielectric constant that is greater than silicon dioxide (so-called high-k dielectric materials) such as $Nb_2O_5$ and similar metal oxides are promising candidates as insulators in metal-insulator-metal (MIM) capacitors due to their desired physical and electrical properties.

Maximizing capacitor surface area by adopting high complex, high aspect ratio feature patterning increases the challenges for the necessary metal and insulators. There is a need for cost reduction in capacitor fabrication by reducing complexity and reducing the number of processing steps. There is thus a need for providing capacitor structures that contain conformal electrode layers and conformal high-k material layers and with excellent interface control on high complex, high surface area patterns using a minimal number of processing steps.

SUMMARY

A capacitor structure is provided that includes conformal layers of a lower electrode, a high-k metal oxide dielectric, and an upper electrode. The capacitor structure is formed by a single process which enables the in-situ conformal deposition of the electrode (i.e., metal or metal nitride) and dielectric layers of the capacitor structure. The single process includes atomic layer deposition in which a metal-containing precursor is selected to provide each of the layers of the capacitor structure. The lower electrode layer is formed by utilizing the metal-containing precursor and a first reactive gas, the high-k metal oxide dielectric layer is provided by switching the first reactive gas to a second reactive gas, and the upper electrode layer is provided by switching the second reactive gas back to the first reactive gas.

In one aspect of the present application, a method of forming a semiconductor structure is provided. In one embodiment of the present application, the method includes providing a bottle-shaped opening in a semiconductor substrate. Next, a capacitor structure is formed within the bottle-shaped opening. The formation of the capacitor structure, which is performed in a single process, includes atomic layer deposition of a conformal lower electrode layer, a conformal high-k metal oxide dielectric layer and a conformal upper electrode layer, wherein the atomic layer deposition comprises forming the conformal lower electrode layer utilizing a metal-containing precursor gas and a first reactive gas; forming the conformal high-k metal oxide dielectric layer by switching the first reactive gas to a second reactive gas, while maintaining the metal-containing precursor gas, and forming the conformal upper electrode layer by switching the second reactive gas to the first reactive gas, while maintaining the metal-containing precursor gas.

In another aspect of the present application, a semiconductor structure is provided. In one embodiment of the present application, the semiconductor structure includes a capacitor structure located in a bottle-shaped opening present in a semiconductor substrate. The capacitor structure includes a lower electrode layer composed of a first metal nitride, a high-k metal oxide dielectric layer located on the lower electrode layer, and an upper electrode layer composed of a second metal nitride and located on the high-k metal oxide dielectric layer. In accordance with the present application, each of the lower electrode, the high-k metal oxide dielectric layer and the upper electrode layer of the capacitor structure is a conformal layer, and the first metal nitride and the second metal nitride are composed of a same metal nitride and the metal of the first and second metal nitrides is the same as the metal of the high-k metal oxide dielectric layer.

In another embodiment, the semiconductor structure includes a capacitor structure located in a bottle-shaped opening present in a semiconductor substrate. The capacitor structure includes a lower electrode layer composed of a first metal, a high-k metal oxide dielectric layer located on the lower electrode layer, and an upper electrode layer composed of a second metal and located on the high-k metal oxide dielectric layer. In accordance with the present application, each of the lower electrode, the high-k metal oxide dielectric layer and the upper electrode layer is a conformal layer, and the first metal and the second metal are composed of a same metal and the metal of the first and second metal is the same as the metal of the high-k metal oxide dielectric layer.

DETAILED DESCRIPTION

Figure 1:
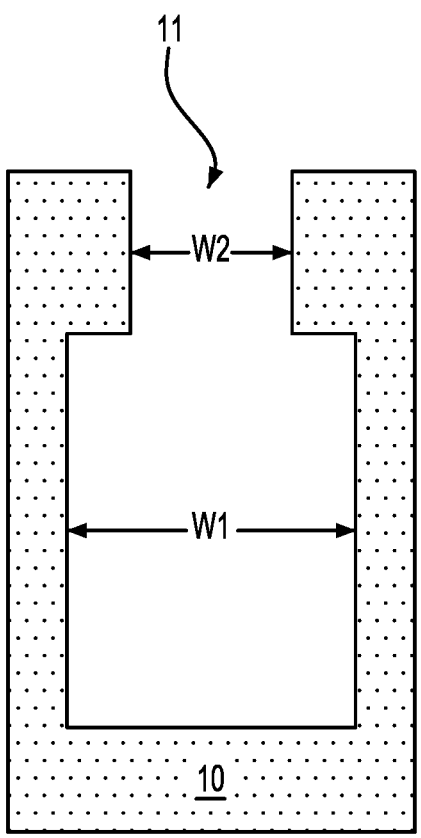
FIG. 1 is a cross sectional view of an exemplary semiconductor structure including at least one bottle-shaped opening present in a semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in accordance with an embodiment of the present application. Notably, FIG. 1 illustrates an exemplary semiconductor structure that includes at least one bottle-shaped opening 11 present in a semiconductor substrate 10. Although the present application describes and illustrates the formation of a single bottle-shaped opening 11, a plurality of bottle-shaped openings can be formed into the semiconductor structure.

The semiconductor substrate 10 may include at least one semiconductor material having semiconducting properties. Examples of semiconductor materials that may provide at least a portion of the semiconductor substrate 10 may include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

The semiconductor substrate 10 is typically a bulk semiconductor substrate. By "bulk" it is meant that the semiconductor substrate 10 is entirely composed of at least one semiconductor material, as defined above. In one example, the semiconductor substrate 10 may be entirely composed of silicon. In some embodiments, the bulk semiconductor substrate may include a multilayered semiconductor material stack including at least two different semiconductor materials, as defined above. In one example, the multilayered semiconductor material stack may comprise, in any order, a stack of Si and a silicon germanium alloy.

The semiconductor material that provides the semiconductor substrate 10 may be a single crystalline semiconductor material. The semiconductor material that provides the semiconductor substrate 10 may have any of the well known crystal orientations. For example, the crystal orientation of the semiconductor substrate 10 may be {100}, {110}, or {111}. Other crystallographic orientations besides those specifically mentioned can also be used in the present application.

In some embodiments (not shown), the semiconductor substrate 10 may include a semiconductor-on-insulator (SOI) substrate. As is known to those skilled in the art, an SOI substrate includes a handle substrate, an insulator layer and a top semiconductor material layer. When an SOI substrate is employed, the at least one bottle-shaped opening 11 can extend into the handle substrate of the SOI substrate. The handle substrate may be composed of a semiconductor material, the insulator layer may be composed of a crystalline or non-crystalline dielectric material such as, for example, silicon dioxide, and the top semiconductor may be composed of a semiconductor material.

As mentioned above, the semiconductor structure includes at least one bottle-shaped opening 11 present therein. By "bottle-shaped" it is meant that the opening has a lower portion that has a first width, w1, and an upper portion that has a second width, w2, wherein w2 is less than w1. In one embodiment, the first width, w1, of the lower portion of the at least one bottle-shaped opening 11 is at least 1.5 times greater than the second width, w2, of the upper portion of the at least one bottle-shaped opening 11. In one example, the first width, w1, of the lower portion of the at least one bottle-shaped opening 11 can be from 15 nm to 1500 nm, while the second width, w2, of the upper portion of the at least one bottle-shaped opening 11 can be from 10 nm to 1000 nm. The bottle-shaped opening 11 provides a re-entrant topography to the semiconductor substrate 10 that has a high surface area.

The at least one bottle-shaped opening 11 extends from a topmost surface of the semiconductor substrate 10 and into a sub-surface portion of the semiconductor substrate 10. By "sub-surface portion" it is meant a portion of a material that is located between a topmost surface of the material and the bottommost surface of the material. In one embodiment, the at least one bottle-shaped opening 11 has a depth, as measured from the topmost surface of the semiconductor substrate 10 to the exposed bottommost surface of the bottle-shaped opening 11, of from 10 nm to 500 nm.

The at least one bottle-shaped opening 11 can be formed utilizing conventional techniques well known to those skilled in the art. In one example, the at least one bottle-shaped opening 11 can be formed by first providing a non-bottle-shaped opening into the semiconductor substrate 10; the entirety of the non-bottle shaped opening can have the second width, w2, mentioned above.

In some embodiments of the present application and prior to forming the non-bottle-shaped opening into the semiconductor substrate 10, a hard mask (not shown) may be formed on the topmost surface of the semiconductor substrate. The hard mask may include a dielectric hard mask material such as, for example, silicon dioxide, silicon nitride and/or silicon oxynitride. In one embodiment, the dielectric hard mask material that provides the hard mask may be formed by a deposition process such as, for example, chemical vapor deposition or plasma enhanced chemical vapor deposition. In another embodiment, the dielectric hard mask material that provides the hard mask may be formed by a thermal process such as, for example, a thermal oxidation and/or a thermal nitridation process. In yet another embodiment, the dielectric hard mask material that provides the hard mask may be formed by a combination of a deposition process and a thermal process. When present, the hard mask may have a thickness from 5 nm to 50 nm. Other thicknesses that are lesser than 5 nm and/or greater than 50 nm may also be employed as the thickness of the hard mask.

The non-bottle-shaped opening can be formed by lithography and etching. Lithography includes forming a photoresist material (not shown) atop a material or material stack (i.e., the semiconductor substrate 10 or the hard mask/semiconductor substrate material stack) to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers i.e., the semiconductor substrate 10 or the hard mask/semiconductor substrate material stack) utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used.

Following the formation of the non-bottle-shaped opening, the patterned photoresist can be stripped utilizing a conventional photoresist removal process such as, for example, ashing. Next, a sacrificial collar (not shown) is typically formed in an upper portion of the non-bottle shaped opening, while leaving a bottom portion of the non-bottle-shaped opening exposed for further processing. In some embodiments and when a hard mask is not employed, the sacrificial collar may include a portion that extends onto the topmost surface of the semiconductor substrate 10. The sacrificial collar may be formed by deposition and etching. The sacrificial collar may include a dielectric material such as, for example, silicon dioxide or silicon nitride. Following the formation of the sacrificial collar, the bottom portion of the non-bottle-shaped opening is widened to have the first width, w1, mentioned above utilizing a lateral etching process that is selective in removing a semiconductor material of the semiconductor substrate 10 as compared to a dielectric material that provides the sacrificial collar and the hard mask. Following the lateral etch, at least the sacrificial collar may be removed utilizing techniques well known to those skilled in the art. In some embodiments, the sacrificial collar and the hard mask are both removed from the exemplary semiconductor structure.

Figure 2:
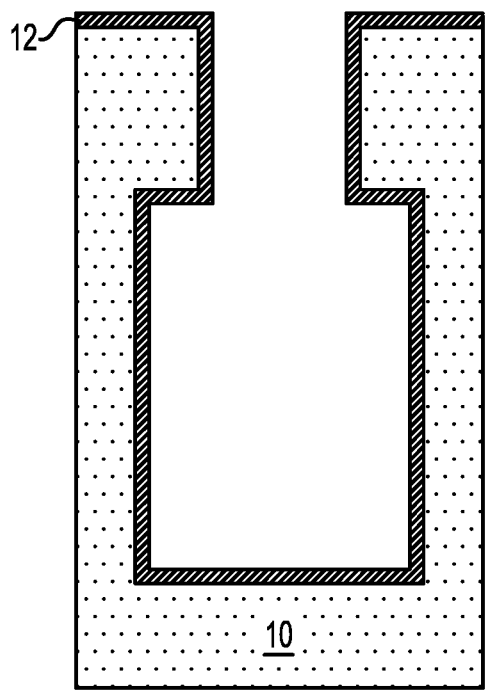
FIG. 2 is a cross sectional view of the exemplary semiconductor structure of FIG. 1 after forming a first conformal metal nitride layer on exposed surfaces of the semiconductor substrate.
Figure 3:
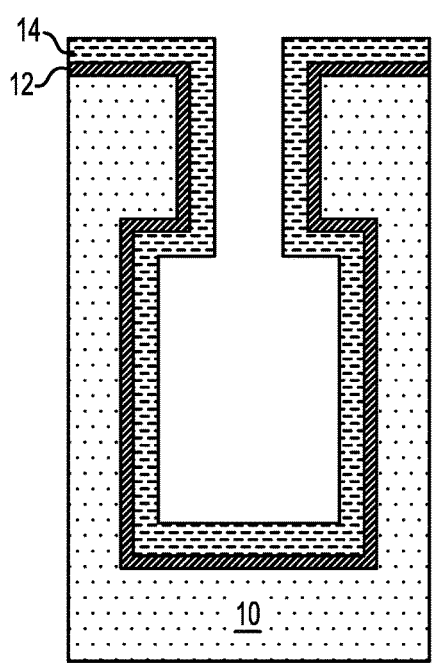
FIG. 3 is a cross sectional view of the exemplary semiconductor structure of FIG. 2 after forming a conformal high-k metal oxide dielectric layer on the first conformal metal nitride layer.
Figure 4:
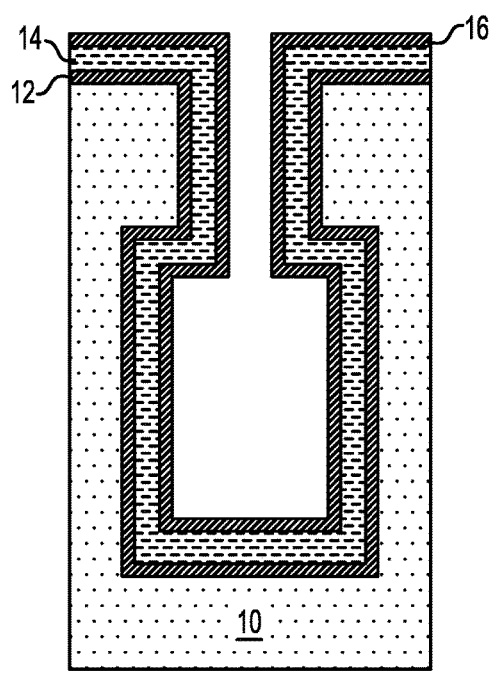
FIG. 4 is a cross sectional view of the exemplary semiconductor structure of FIG. 3 after forming a second conformal metal nitride layer on the conformal high-k metal oxide layer.
Figure 5:
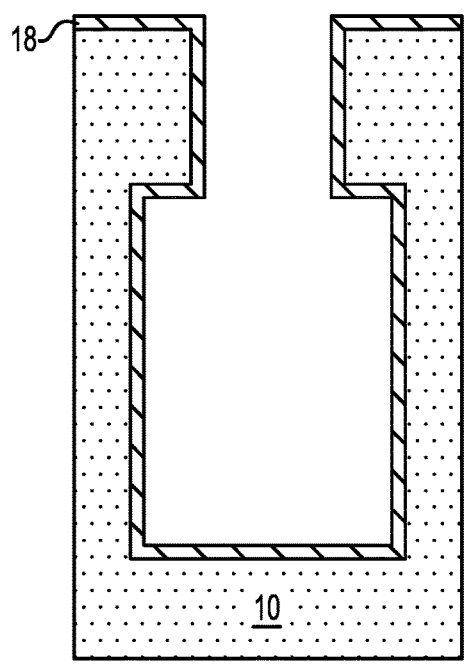
FIG. 5 is a cross sectional view of the exemplary semiconductor structure of FIG. 1 after forming a first conformal metal layer on the exposed surfaces of the semiconductor substrate.
Figure 6:
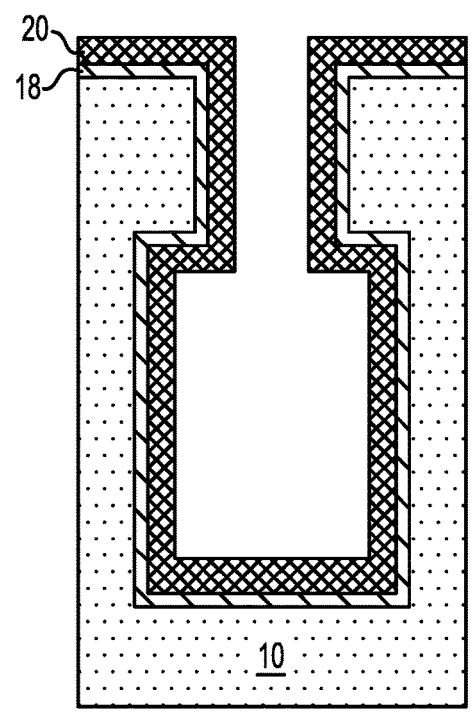
FIG. 6 is a cross sectional view of the exemplary semiconductor structure of FIG. 5 after forming a conformal high-k metal oxide dielectric layer on the first conformal metal layer.
Figure 7:
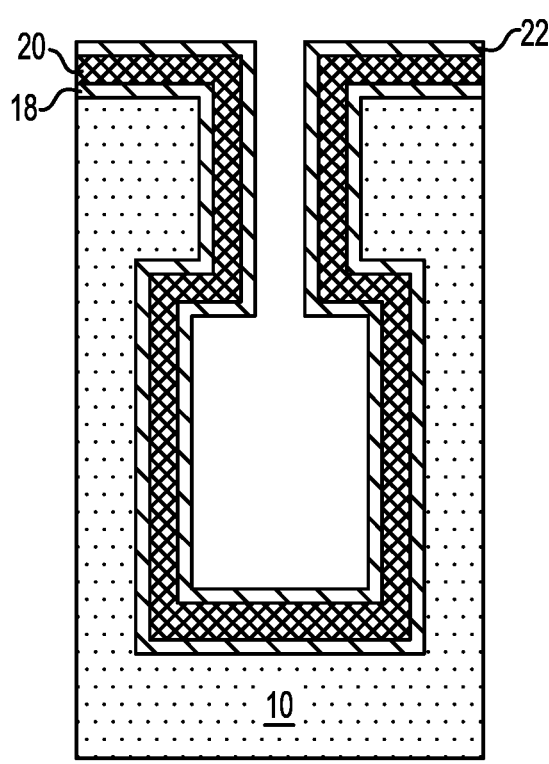
FIG. 7 is a cross sectional view of the exemplary semiconductor structure of FIG. 6 after forming a second conformal metal layer on the conformal high-k metal oxide dielectric layer.

After providing the exemplary semiconductor structure shown in FIG. 1, a capacitor structure is provided that includes conformal layers of a lower electrode, a high-k metal oxide dielectric, and an upper electrode. The term "conformal" as used throughout the present application denotes that the particular layer of the capacitor structure has a same thickness as measured along a vertical surface as compared to a horizontal surface. The capacitor structure is formed by a single process which enables the in-situ conformal deposition of the electrode (i.e., metal or metal nitride) and dielectric layers of the capacitor structure. The single process includes atomic layer deposition in which a metal-containing precursor is selected to provide each of the layers of the capacitor structure. The lower electrode layer is formed by utilizing the metal-containing precursor and a first reactive gas, the high-k metal oxide dielectric layer is provided by switching the first reactive gas to a second reactive gas, and the upper electrode layer is provided by switching the second reactive gas back to the first reactive gas. The atomic layer deposition of the various layers of the capacitor structure of the present is performed without exposure of any of the interfaces to air. The formation of the capacitor structure will now be described in greater detail in references to FIGS. 2-7. FIGS. 2-4 illustrate an embodiment in which the lower and upper electrode layers are composed of a metal nitride, while FIGS. 5-7 illustrate an embodiment with which the lower and upper electrode layers are composed of a metal. In each of the embodiments, the insulator layer that is formed between the upper and lower electrodes is composed of a high-k metal oxide dielectric in which the metal of the high-k metal oxide dielectric layer and the metal that provides the lower and upper electrode layers are the same.

Referring now to FIG. 2, there is illustrated the exemplary semiconductor structure of FIG. 1 after forming a first conformal metal nitride layer 12 on exposed surfaces of the semiconductor substrate 10. In some embodiments and as is shown, the first conformal metal nitride layer 12 is formed on an exposed topmost surface of the semiconductor substrate 10 and within the bottle-shaped opening 11. The first conformal metal nitride layer 12 of this embodiment provides the lower electrode layer of the capacitor structure.

In this embodiment of the present application, the first conformal metal nitride layer 12 is formed during an initial stage (i.e., first cycle) of the atomic layer deposition process. The first conformal metal nitride layer 12 is formed by providing a metal-containing precursor gas and a first reactive gas. Notably, the forming the first conformal metal nitride layer 12 is performed by providing a pulse of the metal-containing precursor which forms molecules of the metal-containing precursor on the exposed surface of the semiconductor substrate, followed by a pulse of the first reactive gas which reacts with the molecules of the metal-containing precursor and forms the first conformal metal nitride layer 12. A purge step performed in an inert ambient may be performed between the pulse of the metal-containing precursor gas and the pulse of the first reactive gas, as well as after the pulse of the first reactive gas. The first cycle may be performed any number of times to provide a first conformal metal nitride layer 12 of a desired thickness.

The metal-containing precursor gas that can be used in providing the first conformal metal nitride layer 12 may include a metal such as, for example, niobium (Nb), titanium (Ti), zirconium (Zr), hafnium (Hf), or tantalum (Ta). Such metals may be a component of a metal complex that includes various organic ligands. In one embodiment, the metal-containing precursor gas that provides the first conformal metal nitride layer 12 is an alkylamide-based metal-containing precursor gas. In one example, the alkylamide-based metal-containing precursor gas is (t-butylimido)tris(diethylamino) Nb.

The first reactive gas that is used is composed of any reactive gas that is capable of forming a metal nitride layer from the metal-containing precursor gas. In this embodiment, the first reactive gas is any reducing gas such as, for example, $NH_3$.

The pulse of metal-containing precursor, the inert purge and the pulse of the first reactive gas may be performed at a temperature from 50° C. to 450° C. Other temperatures may be employed as long as the selected temperature is capable of forming the first conformal metal nitride layer 12. The amount of metal-containing precursor used to provide the first conformal metal nitride layer 12 is sufficient to saturate the entirety of the exposed surfaces of the semiconductor substrate 10 with molecules of the metal-containing precursor. The purge can be used to remove any excess metal-containing precursor that does not react with the surface of the semiconductor substrate 10. The amount of first reactive gas is sufficient to convert the molecules of the metal-containing precursor into the first conformal metal nitride layer 12. Any excess first reactive gas may be removed by a subsequently performed purge step.

The thickness of the first conformal metal nitride layer 12 can be from 5 nm to 50 nm. Other thickness that are lesser than, or greater than the aforementioned values may also be employed in the present application so long as the first conformal metal nitride layer 12 does not fill in the entire volume of the bottle-shaped opening 11.

Referring now to FIG. 3, there is illustrated the exemplary semiconductor structure of FIG. 2 after forming a conformal high-k metal oxide dielectric layer 14 on the first conformal metal nitride layer 12; the conformal high-k metal oxide dielectric layer forms the insulator layer of the inventive capacitor structure. The term "high-k" denotes a material that has a dielectric constant that is greater than the dielectric constant of silicon dioxide (silicon dioxide typically has a dielectric constant of 4.0 thus the conformal high-k metal oxide dielectric layer 14 that is formed has a dielectric constant of greater than 4.0).

The conformal high-k metal oxide dielectric layer 14 is formed during an intermediate (i.e., second cycle) of the atomic layer deposition process of the present application. The conformal high-k metal oxide dielectric layer 14 is formed without exposing the resultant first conformal metal nitride layer 12 to air by switching the first reactive gas to a second reactive gas while maintaining the use of the metal-containing precursor used to provide the first conformal metal nitride layer 12. Notably, the conformal high-k metal oxide dielectric layer 14 is formed by providing a pulse of the metal-containing precursor which forms molecules of the metal-containing precursor on the exposed surface of the first conformal metal nitride layer 12, followed by a pulse of the second reactive gas which reacts with the molecules of the metal-containing precursor and forms the conformal high-k metal oxide dielectric layer 14 on the conformal first conformal metal nitride layer 12. A purge step performed in an inert ambient may be performed between the pulse of the metal-containing precursor gas and the pulse of the second reactive gas, as well as after the pulse of the second reactive gas. The second cycle may be performed any number of times to provide a conformal high-k metal oxide dielectric layer 14 of a desired thickness.

Since the metal-containing precursor used to provide the conformal high-k metal oxide dielectric layer 14 is the same as the metal-containing precursor used to provide the first conformal metal nitride layer 12, the metal that is present in the conformal high-k metal oxide dielectric layer 14 is the same as the metal that is present in the first conformal metal nitride layer 12. In one example, the conformal high-k metal oxide dielectric layer 14 and the first conformal metal nitride layer 12 each contain Nb. In such an embodiment, the high-k metal oxide dielectric layer 14 can be composed of niobium oxide. Besides niobium oxide, the high-k metal oxide dielectric layer 14 that can be provided may include titanium oxide, zirconium oxide, hafnium oxide or tantalum oxide.

In this embodiment of the present application, the second reactive gas that is used is composed of any reactive gas that is capable of forming a metal oxide layer from the metal-containing precursor gas. In this embodiment, the second reactive gas is any oxidizing gas such as, for example, $O_2$.

The pulse of metal-containing precursor, the inert purge and the pulse of the second reactive gas may be performed at a temperature from 50° C. to 450° C. Other temperatures may be employed as long as the selected temperature is capable of forming the conformal high-k metal oxide dielectric layer 14. The amount of metal-containing precursor used to provide the high-k metal oxide dielectric layer 14 is sufficient to saturate the entirety of the exposed surface of the first conformal metal nitride layer 12 with molecules of the metal-containing precursor. The purge can be used to remove any excess metal-containing precursor that does not react with the surface of the first conformal metal nitride layer 12. The amount of second reactive gas is sufficient to convert the molecules of the metal-containing precursor into the conformal high-k metal oxide dielectric layer 14. Any excess second reactive gas may be removed by a subsequently performed purge step.

The thickness of the conformal high-k metal oxide dielectric layer 14 can be from 1 nm to 20 nm. Other thickness that are lesser than, or greater than the aforementioned values may also be employed in the present application so long as the conformal high-k metal oxide dielectric layer 14 does not fill in the remaining volume of the bottle-shaped opening 11.

Referring now to FIG. 4, there is illustrated the exemplary semiconductor structure of FIG. 3 after forming a second conformal metal nitride layer 16 on the conformal high-k metal oxide dielectric layer 14. The second conformal metal nitride layer 16 of this embodiment provides the upper electrode layer of the capacitor structure.

The second conformal metal nitride layer 16 is formed during a later stage (i.e., third cycle) of the atomic layer deposition process. The second conformal metal nitride layer 16 is formed without exposing the resultant conformal high-k metal oxide dielectric layer 14 to air by switching the second reactive gas to the first reactive gas while maintaining the use of the metal-containing precursor used to provide the first conformal metal nitride layer 12. Notably, the second conformal metal nitride layer 16 is formed by providing a metal-containing precursor gas and the first reactive gas. Specifically, the formation of the second conformal metal nitride layer 16 is performed by providing a pulse of the metal-containing precursor which forms molecules of the metal-containing precursor on the exposed surface of the conformal high-k metal oxide dielectric layer 14, followed by a pulse of the first reactive gas which reacts with the molecules of the metal-containing precursor and forms the second conformal metal nitride layer 16. A purge step performed in an inert ambient may be performed between the pulse of the metal-containing precursor gas and the pulse of the first reactive gas, as well as after the pulse of the first reactive gas. The third cycle may be performed any number of times to provide a second conformal metal nitride layer 16 of a desired thickness.

The metal-containing precursor gas that can be used in providing the second conformal metal nitride layer 16 is the same as used in providing the first conformal metal nitride layer 12 and the conformal high-k metal oxide dielectric layer 14. Thus, the first conformal metal layer 12, the conformal high-k metal oxide dielectric layer 14, and the second conformal metal nitride layer 16 each include a same metal such as, for example, niobium (Nb), titanium (Ti), zirconium (Zr), hafnium (Hf), or tantalum (Ta).

The first reactive gas that is used is composed of any reactive gas that is capable of forming a metal nitride layer from the metal-containing precursor gas. In this embodiment, the first reactive gas is any reducing gas such as, for example, $NH_3$. The first reactive gas used in the third cycle of the atomic layer deposition process may be the same as or different from, typically the same as, the first reactive gas used in the first cycle of the atomic layer deposition process.

The pulse of metal-containing precursor, the inert purge and the pulse of the first reactive gas may be performed at a temperature from 50° C. to 450° C. Other temperatures may be employed as long as the selected temperature is capable of forming the second conformal metal nitride layer 16. The amount of metal-containing precursor used to provide the second conformal metal nitride layer 16 is sufficient to saturate the entirety of the exposed surface of the conformal high-k metal oxide dielectric layer 14 with molecules of the metal-containing precursor. The purge can be used to remove any excess metal-containing precursor that does not react with the surface of the conformal high-k metal oxide dielectric layer 14. The amount of first reactive gas is sufficient to convert the molecules of the metal-containing precursor into the second conformal metal nitride layer 16. Any excess first reactive gas may be removed by a subsequently performed purge step.

The thickness of the second conformal metal nitride layer 16 can be from 5 nm to 50 nm. Other thickness that are lesser than, or greater than the aforementioned values may also be employed in the present application. Typically, the second conformal metal nitride layer 16 does not fill in the entire volume of the bottle-shaped opening 11.

At this point of the present application, the capacitor structure (12, 14, 16) shown in FIG. 4 may be subjected to further well known processing steps such as, for example, filling the remaining volume of the bottle-shaped opening 11 with a trench dielectric material, and forming a transistor structure above and in communication with the capacitor structure of the present application.

Referring now to FIG. 5, there is illustrated the exemplary semiconductor structure of FIG. 1 after forming a first conformal metal layer 18 on the exposed surfaces of the semiconductor substrate 10. In some embodiments and as is shown, the first conformal metal layer 18 is formed on an exposed topmost surface of the semiconductor substrate 10 and within the bottle-shaped opening 11. The first conformal metal layer 18 of this embodiment provides the lower electrode layer of the capacitor structure.

In this embodiment of the present application, the first conformal metal layer 18 is formed during an initial stage (i.e., first cycle) of the atomic layer deposition process. The first conformal metal layer 18 is formed by providing a metal-containing precursor gas and a first reactive gas. Notably, the forming the first conformal metal layer 18 is performed by providing a pulse of the metal-containing precursor which forms molecules of the metal-containing precursor on the exposed surface of the semiconductor substrate, followed by a pulse of the first reactive gas which reacts with the molecules of the metal-containing precursor and forms the first conformal metal layer 18. A purge step performed in an inert ambient may be performed between the pulse of the metal-containing precursor gas and the pulse of the first reactive gas, as well as after the pulse of the first reactive gas. The first cycle may be performed any number of times to provide a first conformal metal layer 18 of a desired thickness.

The metal-containing precursor gas that can be used in providing the first conformal metal layer 18 may include a metal such as, for example, niobium (Nb), titanium (Ti), zirconium (Zr), hafnium (Hf), or tantalum (Ta). Such metals may be a component of a metal complex that includes various organic ligands. In one embodiment, the metal-containing precursor gas that provides the first conformal metal layer 18 is a cyclopentadienyl-based metal-containing precursor gas. In one example, the cyclopentadienyl-based metal-containing precursor gas is trihydridobis(pentamethylcyclopentadienyl) niobium.

The first reactive gas that is used is composed of any reactive gas that is capable of forming a metal layer from the metal-containing precursor gas. In this embodiment, the first reactive gas is any reducing gas such as, for example, $H_2$.

The pulse of metal-containing precursor, the inert purge and the pulse of the first reactive gas may be performed at a temperature from 50° C. to 450° C. Other temperatures may be employed as long as the selected temperature is capable of forming the first conformal metal layer 18. The amount of metal-containing precursor used to provide the first conformal metal layer 18 is sufficient to saturate the entirety of the exposed surfaces of the semiconductor substrate 10 with molecules of the metal-containing precursor. The purge can be used to remove any excess metal-containing precursor that does not react with the surface of the semiconductor substrate 10. The amount of first reactive gas is sufficient to convert the molecules of the metal-containing precursor into the first conformal metal layer 18. Any excess first reactive gas may be removed by a subsequently performed purge step.

The thickness of the first conformal metal layer 18 can be from 5 nm to 50 nm. Other thickness that are lesser than, or greater than the aforementioned values may also be employed in the present application so long as the first conformal metal layer 18 does not fill in the entire volume of the bottle-shaped opening 11.

Referring now to FIG. 6, there is illustrated the exemplary semiconductor structure of FIG. 5 after forming a conformal high-k metal oxide dielectric layer 20 on the first conformal metal layer 18; the conformal high-k metal oxide dielectric layer forms the insulator layer of the inventive capacitor structure.

The conformal high-k metal oxide dielectric layer 20 is formed during an intermediate (i.e., second cycle) of the atomic layer deposition process of the present application. The conformal high-k metal oxide dielectric layer 20 is formed without exposing the resultant first conformal metal layer 18 to air by switching the first reactive gas to a second reactive gas while maintaining the use of the metal-containing precursor used to provide the first conformal metal layer 18. Notably, the conformal high-k metal oxide dielectric layer 20 is formed by providing a pulse of the metal-containing precursor which forms molecules of the metal-containing precursor on the exposed surface of the first conformal metal layer 18, followed by a pulse of the second reactive gas which reacts with the molecules of the metal-containing precursor and forms the conformal high-k metal oxide dielectric layer 20 on the conformal first conformal metal layer 18. A purge step performed in an inert ambient may be performed between the pulse of the metal-containing precursor gas and the pulse of the second reactive gas, as well as after the pulse of the second reactive gas. The second cycle may be performed any number of times to provide a conformal high-k metal oxide dielectric layer 20 of a desired thickness.

Since the metal-containing precursor used to provide the conformal high-k metal oxide dielectric layer 20 is the same as the metal-containing precursor used to provide the first conformal metal layer 18, the metal that is present in the conformal high-k metal oxide dielectric layer 20 is the same as the metal that is present in the first conformal metal layer 18. In one example, the conformal high-k metal oxide dielectric layer 20 and the first conformal metal layer 18 each contain Nb. In such an embodiment, the high-k metal oxide dielectric layer 20 can be composed of niobium oxide. Besides niobium oxide, the high-k metal oxide dielectric layer 20 that can be provided may include titanium oxide, zirconium oxide, hafnium oxide or tantalum oxide.

In this embodiment of the present application, the second reactive gas that is used is composed of any reactive gas that is capable of forming a metal oxide layer from the metal-containing precursor gas. In this embodiment, the second reactive gas is any oxidizing gas such as, for example, $O_2$.

The pulse of metal-containing precursor, the inert purge and the pulse of the second reactive gas may be performed at a temperature from 50° C. to 450° C. Other temperatures may be employed as long as the selected temperature is capable of forming the conformal high-k metal oxide dielectric layer 20. The amount of metal-containing precursor used to provide the high-k metal oxide dielectric layer 20 is sufficient to saturate the entirety of the exposed surface of the first conformal metal layer 18 with molecules of the metal-containing precursor. The purge can be used to remove any excess metal-containing precursor that does not react with the surface of the first conformal metal layer 18. The amount of first reactive gas is sufficient to convert the molecules of the metal-containing precursor into the conformal high-k metal oxide dielectric layer 20. Any excess second reactive gas may be removed by a subsequently performed purge step.

The thickness of the conformal high-k metal oxide dielectric layer 20 can be from 1 nm to 20 nm. Other thickness that are lesser than, or greater than the aforementioned values may also be employed in the present application so long as the conformal high-k metal oxide dielectric layer 20 does not fill in the remaining volume of the bottle-shaped opening 11.

Referring now to FIG. 7, there is illustrated the exemplary semiconductor structure of FIG. 6 after forming a second conformal metal layer 22 on the conformal high-k metal oxide layer 20. The second conformal metal layer 22 of this embodiment provides the upper electrode layer of the capacitor structure.

The second conformal metal layer 22 is formed during a later stage (i.e., third cycle) of the atomic layer deposition process. The second conformal metal layer 22 is formed without exposing the resultant conformal high-k metal oxide dielectric layer 20 to air by switching the second reactive gas to the first reactive gas while maintaining the use of the metal-containing precursor used to provide the first conformal metal layer 18. Notably, the second conformal metal layer 22 is formed by providing a metal-containing precursor gas and the first reactive gas. Specifically, the formation of the second conformal metal layer 22 is performed by providing a pulse of the metal-containing precursor which forms molecules of the metal-containing precursor on the exposed surface of the conformal high-k metal oxide dielectric layer 20, followed by a pulse of the first reactive gas which reacts with the molecules of the metal-containing precursor and forms the second conformal metal layer 22. A purge step performed in an inert ambient may be performed between the pulse of the metal-containing precursor gas and the pulse of the first reactive gas, as well as after the pulse of the first reactive gas. The third cycle may be performed any number of times to provide a second conformal metal layer 22 of a desired thickness.

The metal-containing precursor gas that can be used in providing the second conformal metal layer 22 is the same as used in providing the first conformal metal layer 18 and the conformal high-k metal oxide dielectric layer 20. Thus, the first conformal metal layer 18, the conformal high-k metal oxide dielectric layer 20, and the second conformal metal layer 22 each include a same metal such as, for example, niobium (Nb), titanium (Ti), zirconium (Zr), hafnium (Hf), or tantalum (Ta).

The first reactive gas that is used is composed of any reactive gas that is capable of forming a metal layer from the metal-containing precursor gas. In this embodiment, the first reactive gas is any reducing gas such as, for example, $H_2$. The first reactive gas used in the third cycle of the atomic layer deposition process may be the same as or different from, typically the same as, the first reactive gas used in the first cycle of the atomic layer deposition process.

The pulse of metal-containing precursor, the inert purge and the pulse of the first reactive gas may be performed at a temperature from 50° C. to 450° C. Other temperatures may be employed as long as the selected temperature is capable of forming the second conformal metal layer 22. The amount of metal-containing precursor used to provide the second conformal metal layer 22 is sufficient to saturate the entirety of the exposed surface of the conformal high-k metal oxide dielectric layer 20 with molecules of the metal-containing precursor. The purge can be used to remove any excess metal-containing precursor that does not react with the surface of the conformal high-k metal oxide dielectric layer 20. The amount of first reactive gas is sufficient to convert the molecules of the metal-containing precursor into the second conformal metal layer 22. Any excess first reactive gas may be removed by a subsequently performed purge step.

The thickness of the second conformal metal layer 22 can be from 5 nm to 50 nm. Other thickness that are lesser than, or greater than the aforementioned values may also be employed in the present application. Typically, the second conformal metal layer 22 does not fill in the entire volume of the bottle-shaped opening 11.

At this point of the present application, the capacitor structure (18, 20, 22) shown in FIG. 8 may be subjected to further well known processing steps such as, for example, filling the remaining volume of the bottle-shaped opening 11 with a trench dielectric material, and forming a transistor structure above and in communication with the capacitor structure of the present application.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
providing a bottle-shaped opening having sidewalls and a bottom wall in a semiconductor substrate; and
forming, in-situ and by atomic layer deposition, a capacitor structure in the bottle-shaped opening, said capacitor structure consisting of a conformal lower electrode layer composed entirely of a metal nitride and lining an entirety of the sidewalls and the bottom wall of the bottle-shaped opening and in direct physical contact along the sidewalls and the bottom wall with a semiconductor material of the semiconductor substrate, a conformal high-k dielectric layer composed entirely of a metal oxide and directly on the conformal lower electrode layer, and a conformal upper electrode layer composed entirely of another metal nitride and directly on the conformal high-k dielectric layer, wherein the atomic layer deposition comprises forming the conformal lower electrode layer utilizing a metal-containing precursor gas and a first reactive gas, forming the conformal high-k dielectric layer by switching the first reactive gas to a second reactive gas, while maintaining the metal-containing precursor gas, and forming the conformal upper electrode layer by switching the second reactive gas to the first reactive gas, while maintaining the metal-containing precursor gas, wherein the first reactive gas is a reducing gas, and the second reactive gas is an oxidizing gas.

2. The method of claim 1, wherein the first reactive gas is $NH_3$.

3. The method of claim 1, wherein said metal nitride and the another metal nitride are selected from the group consisting of niobium (Nb) nitride, titanium (Ti) nitride, zirconium (Zr) nitride, hafnium (Hf) nitride, and tantalum (Ta) nitride.

4. The method of claim 3, wherein the metal-containing precursor gas is an alkylamide-based metal-containing precursor gas and the first reactive gas is $NH_3$.

5. The method of claim 4, wherein the alkylamide-based metal-containing precursor gas is (t-butylimido)tris(diethylamino) niobium.

6. The method of claim 4, wherein the second reactive gas is $O_2$.

7. The method of claim 1, wherein the bottle-shaped opening has a lower portion of a first width, w1, and an upper portion of a second width, w2, wherein w2 is less than w1, wherein the first width, w1, of the lower portion of the bottle-shaped opening is at least 1.5 times greater than the second width, w2, of the upper portion of the bottle-shaped opening.

8. A method of forming a semiconductor structure, the method comprising:

providing a bottle-shaped opening having sidewalls and a bottom wall in a semiconductor substrate; and forming, in-situ and by atomic layer deposition, a capacitor structure in the bottle-shaped opening, said capacitor structure consisting of a conformal lower electrode layer composed entirely of a single elemental metal lining an entirety of the sidewalls and the bottom wall of the bottle-shaped opening and in direct physical contact along the sidewalls and the bottom wall with a semiconductor material of the semiconductor substrate, a conformal high-k dielectric layer composed entirely of a metal oxide and directly on the conformal lower electrode layer, and a conformal upper electrode layer composed entirely of another single elemental metal and directly on the conformal high-k dielectric layer, wherein the atomic layer deposition comprises forming the conformal lower electrode layer utilizing a metal-containing precursor gas and a first reactive gas, forming the conformal high-k dielectric layer by switching the first reactive gas to a second reactive gas, while maintaining the metal-containing precursor gas, and forming the conformal upper electrode layer by switching the second reactive gas to the first reactive gas, while maintaining the metal-containing precursor gas, and wherein the first reactive gas is a reducing gas, and the second reactive gas is an oxidizing gas.

9. The method of claim 8, wherein said single elemental metal and said another elemental metal are selected from the group consisting of niobium (Nb), titanium (Ti), zirconium (Zr), hafnium (Hf), and tantalum (Ta).

10. The method of claim 9, wherein the metal-containing precursor gas is a cyclopentadienyl-based metal-containing precursor gas and the first reactive gas is $H_2$.

11. The method of claim 10, wherein the cyclopentadienyl-based metal-containing precursor gas is trihydridobis (pentamethylcyclopentadienyl) niobium.

12. The method of claim 9, wherein the second reactive gas is $O_2$.

13. The method of claim 1, wherein the first reactive gas is hydrogen.

* * * * *